United States Patent [19]

Bizen

[11] Patent Number: 5,379,003
[45] Date of Patent: Jan. 3, 1995

[54] VCO AND BUFFER HAVING NOISE FILTER ON POWER SUPPLY LINE

[75] Inventor: Tatsuo Bizen, Kyoto, Japan

[73] Assignee: Murata Manufacturing Co., Ltd., Kyoto, Japan

[21] Appl. No.: 164,370

[22] Filed: Dec. 9, 1993

[30] Foreign Application Priority Data

Dec. 16, 1992 [JP] Japan .................................. 4-336083

[51] Int. Cl.6 .............................................. H03B 5/12
[52] U.S. Cl. .............................. 331/117 R; 331/177 V; 331/185
[58] Field of Search ........ 331/117 R, 117 FE, 177 R, 331/177 V, 116 R, 116 FE, 185

[56] References Cited

U.S. PATENT DOCUMENTS 4,709,409  11/1987  Ma et al. ..................... 331/177 VX

FOREIGN PATENT DOCUMENTS 1264229  2/1972  United Kingdom .
1305542  2/1973  United Kingdom .
1424467  2/1976  United Kingdom .
1472884  5/1977  United Kingdom .

*Primary Examiner*—Siegfried H. Grimm
*Attorney, Agent, or Firm*—Ostrolenk, Faber, Gerb & Soffen

[57] ABSTRACT

A voltage-controlled oscillation circuit includes a power supply terminal for supplying power to an oscillation stage, a buffer stage, and an output matching stage. Connected between the power supply terminal and ground is a high frequency bypass capacitor for bypassing electrical noise superimposed on the power supply to the side of ground, a voltage feedback resistor is connected in series in a power supply line connected to the power supply terminal, the high frequency bypass capacitor and the voltage feedback resistor constitute a low-pass filter, and the capacitance value of the high frequency bypass capacitor and the resistance value of the voltage feedback resistor are determined so that the cut off frequency of the low-pass filter is at most the frequency f0 of noise.

9 Claims, 4 Drawing Sheets

VCO AND BUFFER HAVING NOISE FILTER ON POWER SUPPLY LINE

BACKGROUND OF THE INVENTION

1. Field of the Invention

The present invention relates generally to voltage-controlled oscillation circuits (hereinafter referred to as VCO). More particularly, the invention relates to a voltage-controlled oscillation circuit the oscillation frequency of which changes in response to an externally applied control voltage.

2. Description of the Background Art

FIG. 1 is a circuit diagram showing one example of a conventional VCO. In FIG. 1, VCO 1 includes an oscillation stage 2, a buffer stage 3, and an output matching stage 4. Oscillation stage 2 has its oscillation frequency changed in response to a control voltage applied to its control terminal C. Buffer stage 3 prevents the oscillation frequency at oscillation stage 2 from being changed due to load fluctuations. Output matching stage 4 performs matching with a succeeding stage circuit connected to an output terminal P and suppresses harmonics. Oscillation stage 2 includes a resonance circuit 21. Resonance circuit 21 includes a choke coil L3, a varactor diode VD for changing the resonance frequency of the resonance circuit 21, a coupling capacitor C9, and a resonance inductor L2, and a control voltage is applied from control terminal C through choke coil L3 to the cathode of varactor diode VD and one end of coupling capacitor C9. Varactor diode VD has its anode grounded, while the other end of coupling capacitor C9 is connected to one end of resonance inductor L2 and one end of a coupling capacitor C8. The other end of resonance inductor L2 is grounded.

Oscillation stage 2 includes an oscillation transistor Q2 having a base connected to the other end of capacitor C8. The base of oscillation transistor Q2 is also provided as a bias voltage with a voltage produced by voltage dividing by bias resistors R1, R2, and R3 connected in series between a power supply terminal B and ground. A capacitor C6 is connected between the base and emitter of oscillation transistor Q2, while a resistor R4 and a capacitor C7 are connected in parallel between the emitter of oscillation transistor Q2 and ground. Capacitors C6 and C7 constitute a Colpitts capacitance, and oscillation transistor Q2 together with capacitors C6, C7 and resonance inductor L2 constitute a Colpitts oscillator and oscillates according to a frequency at which resonance occurs in resonance circuit 21.

The oscillation output of oscillation stage 2 is applied to buffer stage 3 through coupling capacitor C5. Buffer stage 3 includes a buffer transistor Q1 having its base provided with the oscillation output of oscillation stage 2, and a high frequency bypass capacitor C4 connected between the emitter of buffer transistor Q1 and ground, and the emitter of buffer transistor Q1 is also connected to the collector of oscillation transistor Q2. Buffer transistor Q1 receives at its base the oscillation output of oscillation stage 2, and outputs the same from its collector for application to output matching stage 4.

Output matching stage 4 includes a choke coil L1, a high frequency bypass capacitor C1, a coupling capacitor C2, and an output matching capacitor C3. High frequency bypass capacitor C1 is connected between power supply terminal B and ground, power supply terminal B is connected to one end of choke coil L1, and the other end of choke L1 is connected to the collector of buffer transistor Q1 and to output terminal P through coupling capacitor C2. The other end of choke coil L1 is also grounded through output matching capacitor C3.

In the VCO as illustrated in FIG. 1, frequency variation varactor diode VD in resonance circuit 21 has its capacitance changed in response to control voltage input to a control terminal C. Resonance circuit 21 provides resonance in response to the capacitances of coupling capacitor C9, and frequency variation varactor diode VD, and resonance inductor L2, and oscillation transistor Q2 oscillates at the resonance frequency. The oscillation output is applied to the base of buffer transistor Q1 through coupling capacitor C5, and the oscillation output is output from the collector of buffer transistor Q1 and output from output terminal P through coupling capacitor C2.

FIG. 2 is a circuit diagram showing another example of a conventional VCO. VCO 10 shown in FIG. 2 as is the case with VCO 1 in FIG. 1 includes an oscillation stage 2, a buffer stage 30, and an output matching stage 4. In the example shown in FIG. 1, bias resistors R1, R2, and R3 are connected between power supply terminal B and ground, divided voltage at the connection point of bias resistors R1 and R2 is applied to the base of buffer transistor Q1 as a bias voltage, and divided voltage at the connection point of bias resistors R2 and R3 is applied to the base of oscillation transistor Q2 as a bias voltage, but in VCO 10 in FIG. 2, separate power supply paths are provided for oscillation stage 2, and for buffer stage 30 and output matching stage 4. More specifically, power supply terminal B is connected to the collector of oscillation transistor Q2, a series circuit of bias resistors R2 and R3 is connected between power supply terminal B and ground, and divided voltage at the connection point of bias resistors R2 and R3 is provided to the base of oscillation transistor Q2 as a bias voltage.

Power supply terminal B is also connected to the collector of buffer transistor Q1 through choke coil L1, a series circuit of bias resistors R5 and R6 is connected between power supply terminal B and ground, and divided voltage at the connection point of bias resistors R5 and R6 is applied to the base of buffer transistor Q1 as a bias voltage. High frequency bypass capacitors C4, C10 and C1 are connected, respectively between power supply lines BL2, BL3 and BL4 connected to power supply terminal B and ground.

Also in the VCO shown in FIG. 2, oscillation stage 2 oscillates at a frequency in response to a control voltage applied to control terminal C, the oscillation output to the emitter of oscillation transistor Q2 is applied to the base of buffer transistor Q1 through high frequency bypass capacitor C5, and the oscillation output is extracted from the collector of buffer transistor Q1 and output to output terminal P through high frequency bypass capacitor C2.

Note that in the VCO shown in FIG. 1, electrical noise superimposed on power supply line BL1 is bypassed to ground by high frequency bypass capacitor C1 which is connected between power supply line BL1 and ground, and that in the VCO shown in FIG. 2, electrical noise is bypassed to the ground side by high frequency bypass capacitors C4, C10 and C1 connected between power supply lines BL2, BL3 and BL4 and ground. However, when VCOs 1 and 10 shown FIGS. 1 and 2 are used for a PLL (Phase Locked Loop), they cannot sufficiently bypass to the ground side electrical noise having a particular frequency such as a signal of a reference frequency for the PLL, and such as a power supply ripple. Therefore noise not bypassed is superimposed on the bases and collectors of buffer transistor Q1 and oscillation transistor Q2, resulting in degradation in the C/N characteristics, S/N characteristics and the like of VCOs 1 and 10.

SUMMARY OF THE INVENTION

It is therefore a primary object of the invention to provide a voltage-controlled oscillation circuit capable of improving C/N and S/N characteristics by bypassing noise superimposed on a power supply line to the ground side.

Briefly stated, the circuit according to the invention includes an oscillation circuit having its oscillation frequency changed in response to a control voltage, a power supply terminal for supplying the oscillation circuit with power, and a low-pass filter connected between the power supply terminal and ground. The low-pass filter includes capacitance elements connected between the power supply terminal and ground and resistance elements connected in series to a power supply line between the power supply terminal and the capacitance element, and the fixed numbers of capacitance elements and resistance elements are determined so that a cut off frequency is at most the frequency of electrical noise superimposed on the power supply on the side of the power supply terminal including the power supply line.

Therefore, according to the invention, connection of the low-pass filter formed of the capacitance elements and resistance elements with the power supply line permits noise superimposed on the power supply line to be efficiently bypassed to the ground side, resulting in improved C/N and S/N characteristics.

In a preferred embodiment of the invention, a buffer circuit is provided for preventing the oscillation frequency of an oscillation circuit from being changed due to load change when the oscillation output of the oscillation circuit is provided to the load, and power supply lines supplying the oscillation circuit and the buffer circuit with power are separately provided with low-pass filters interposed in the respective power supply lines.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 3:
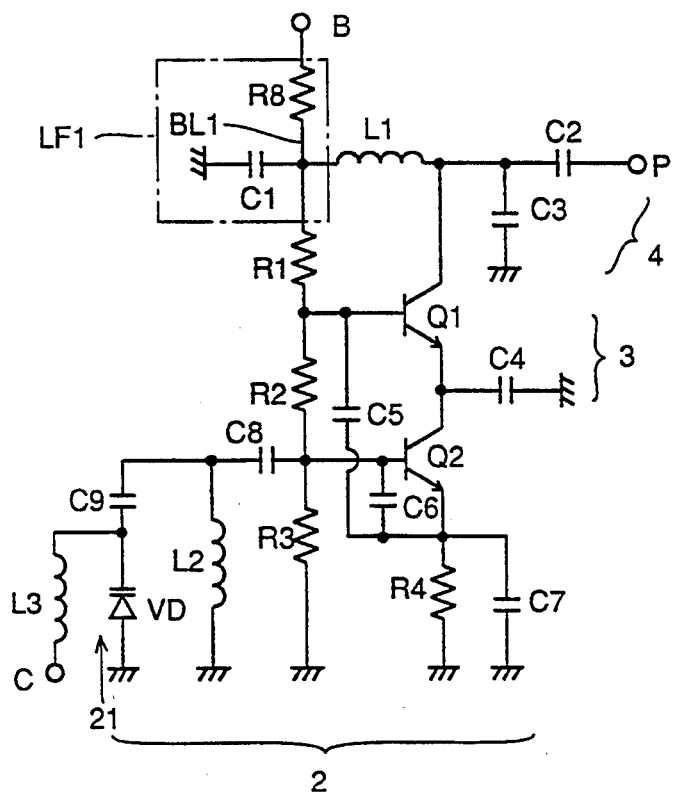
FIG. 3 is a circuit diagram showing one embodiment of the invention.

FIG. 3 is a electrical circuit diagram showing one embodiment of the invention. The embodiment illustrated in FIG. 3 is substantially identical to FIG. 1 with the following essential difference. More specifically, a high frequency bypass capacitor C1 is connected between power supply line BL1 and ground. A voltage feedback resistor R8 is connected in series in power supply line BL1 between power supply terminal B and high frequency bypass capacitor C1. Thus, high frequency bypass capacitor C1 and voltage feedback resistor R8 constitute a low-pass filter LF1.

In low-pass filter LF1, for the capacitance value of high frequency bypass capacitor C1 being c1 and the resistance value of voltage feedback resistor R8 being r8, the cut off frequency fh is applied as $fh = 1/(2\pi c1 \cdot r8)$, and for the frequency of noise superimposed on power supply line BL1 being f0, the capacitance value c1 and the resistance value r8 are determined so as to satisfy the expression $fh \leq f0$.

In order to cut off noise at f0=60 kHz or higher, for example, the cut off frequency fh of low-pass filter LF1 should be $fh \leq f0 = 60$ kHz, and therefore the capacitance value of high frequency bypass capacitor C1 and the resistance value of voltage feedback resistor R8 are determined so as to satisfy the expression $c1 \times r8 \geq 2.7 \times 10^{-6}$. Thus, hardly any noise component at or higher than cut off frequency fh is superimposed on the power supply and applied to the bases and collectors of buffer transistor Q1 and oscillation transistor Q2 in the VCO, and therefore a VCO having improved C/N and S/N characteristics can be implemented.

Figure 1:
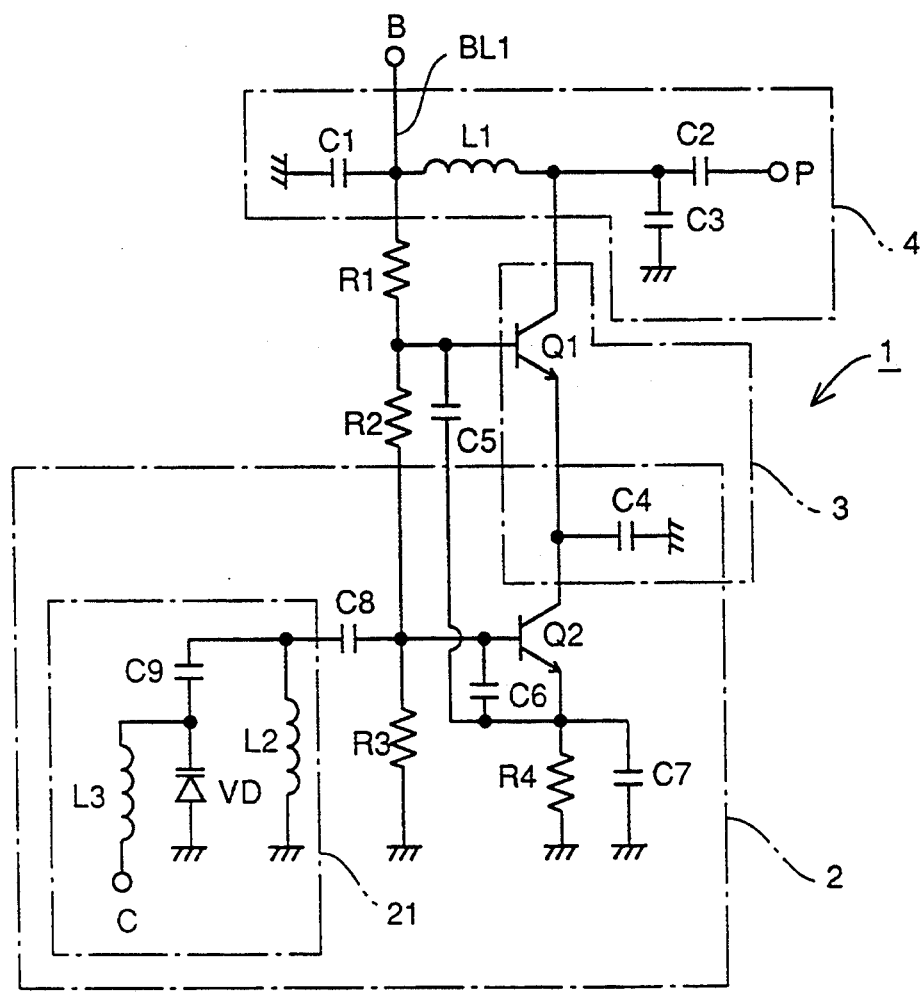
FIG. 1 is a circuit diagram showing one example of a conventional VCO.

The inventor conducted experiments comparing the conventional VCO in FIG. 1 and the VCO according to the invention shown in FIG. 3 for their S/N characteristics, in which noise of 60 kHz was superimposed on power supply terminal B. It was found out that degradation in S/N characteristic by the amount of 20 dB was observed in the conventional VCO, while no such degradation was observed in the embodiment shown in FIG. 3.

Note that voltage feedback resistor R8 in the VCO according to the embodiment shown in FIG. 3 has a function of feeding back the voltage by which collector-emitter voltage decreases, in response to an increase in the collector currents in buffer transistor Q1 and oscillation transistor Q2 at respective temperatures, together with a secondary effect that its operation is stable with respect to temperature changes.

Figure 2:
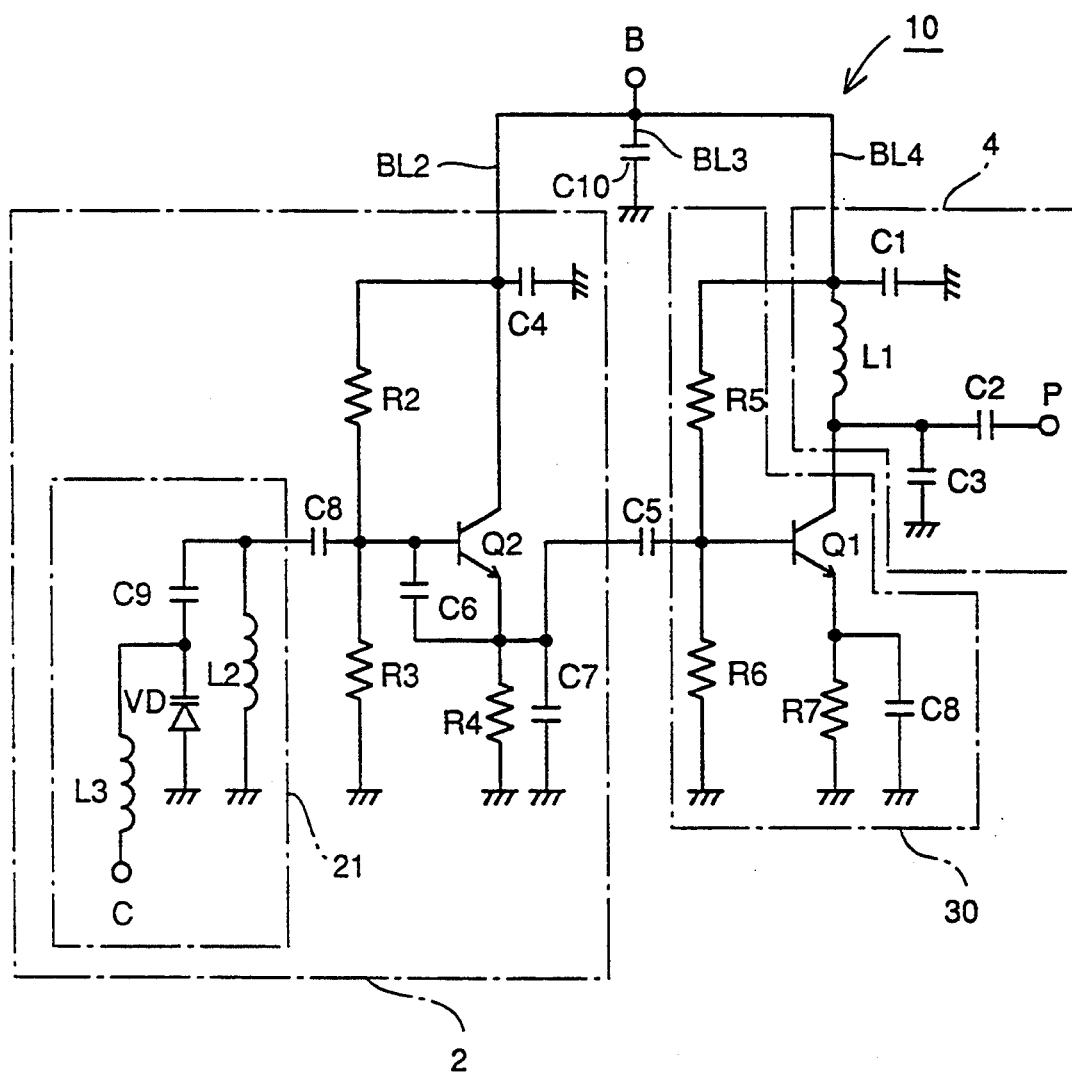
FIG. 2 is a circuit diagram showing another example of a conventional VCO.
Figure 4:
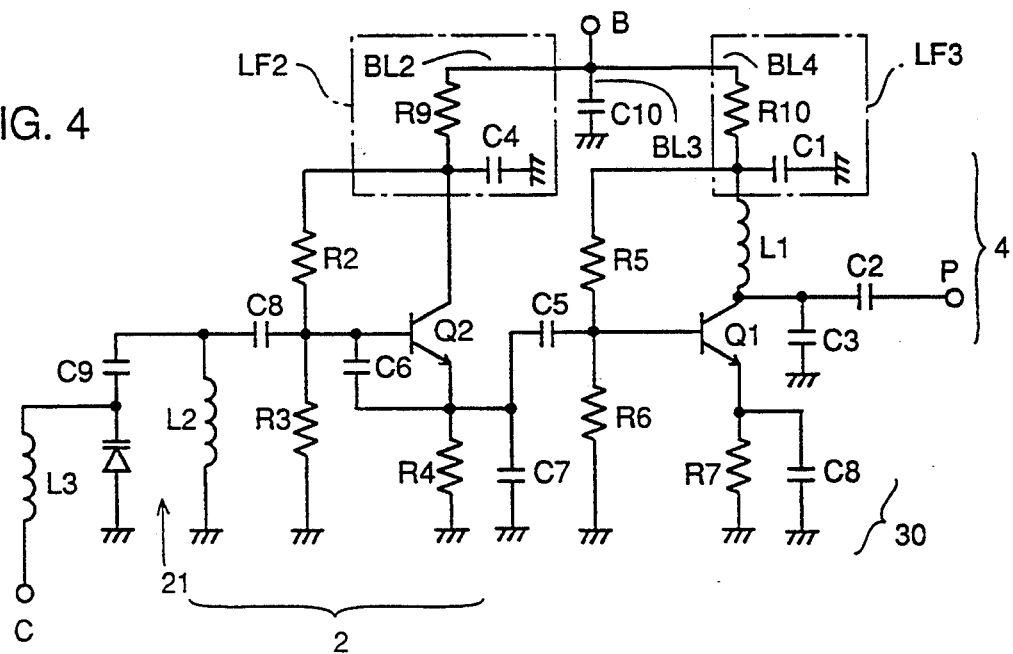
FIG. 4 is a circuit diagram showing another embodiment of the invention.

FIG. 4 is a circuit diagram showing another embodiment of the invention. The embodiment shown in FIG. 4 is substantially identical to FIG. 2 with the following essential difference. More specifically, a voltage feedback resistor R9 is connected to power supply line BL2 on the side of oscillation stage 2, a high frequency bypass capacitor C4 is connected between one end of voltage feedback resistor R9 and ground, and voltage feedback resistor R9 and high frequency bypass capacitor C4 constitute a first low-pass filter LF2. A voltage feedback resistor R10 is interposed in power supply line BL4 on the side of buffer stage 30, and a high frequency bypass capacitor C1 is connected between one end of voltage feedback resistor R10 and ground. Voltage feedback resistor R10 and high frequency bypass capacitor C1 constitute a second low-pass filter LF3.

As is the case with the embodiment shown in FIG. 3, the capacitance values c4 and c1 of high frequency bypass capacitors C4 and C1, and the resistance values r9 and r10 of voltage feedback resistors R9 and R10, are determined so that these low-pass filters LF2 and LF3 cut off noise above particular frequencies superimposed on power supply lines BL2 and BL4, respectively.

In this embodiment, oscillation stage 2 and buffer stage 30, and output matching stage 4 are provided with separate power supply paths, which are individually provided with respective low-pass filters LF2 and LF3, and therefore the C/N and S/N characteristics can be improved as compared to the embodiment shown in FIG. 3.

Figure 5:
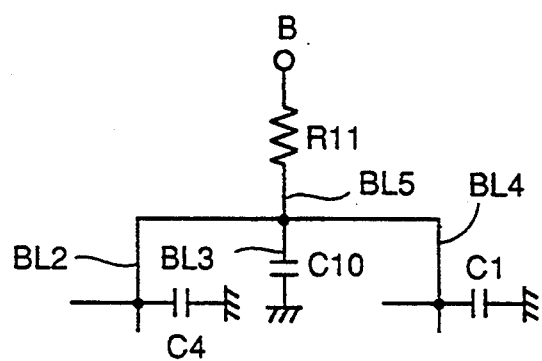
FIG. 5 is a circuit diagram showing an essential part of yet another embodiment of the invention.

FIG. 5 is a circuit diagram showing an essential part of an improved version of the embodiment shown in FIG. 4. In the embodiment shown in FIG. 4 described above, voltage feedback resistor R9 is connected to power supply line BL2, and voltage feedback resistor R10 is connected to power supply line BL4, while in the embodiment shown in FIG. 5, a voltage feedback resistor R11 is connected in series in a power supply line BL5 directly connected to power supply terminal B in place of these voltage feedback resistors R9 and R10. Voltage feedback resistor R11 and high frequency bypass capacitor C4 constitute one low-pass filter, and voltage feedback resistor R11 and high frequency bypass capacitor C1 constitute the other low-pass filter. The resistance value of voltage feedback resistor R11 and the capacitance values of high frequency bypass capacitors C4 and C1 are determined in the same manner as in the embodiment shown in FIG. 3.

Figure 6:
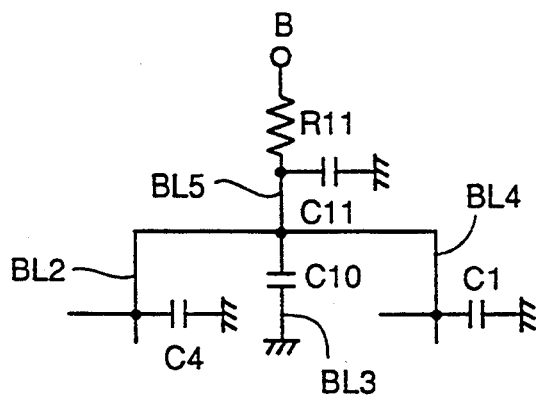
FIG. 6 is a circuit diagram showing an essential part of a still further embodiment of the invention.

FIG. 6 is a circuit diagram showing an essential part of another improved version of the embodiment shown in FIG. 4. In FIG. 6, in addition to the embodiment shown in FIG. 5, a high frequency bypass capacitor C11 is connected between power supply line BL5 and ground, and voltage feedback resistor R11 and high frequency bypass capacitor C11 constitute a low-pass filter. For the low-pass filter, the resistance value of voltage feedback resistor R11 and the capacitance of high frequency bypass capacitor C11 are determined in the same manner as the embodiment shown in FIG. 3. Note that the respective capacitance values may be determined so as to constitute a low-pass filter by including high frequency bypass capacitors C4 and C1 in addition to high frequency bypass capacitor C11.

Although in each of the above-described embodiments, a capacitor and a resistor are used as components for a low-pass filter, any capacitor element or resistance element may be used as long as they can provide capacitance and resistance equivalent to those of a capacitor and a resistor.

As in the foregoing, according to the embodiments of the invention, noise superimposed on a power supply on the side of power supply terminal B can be cut off through a low-pass filter, and therefore noise can be efficiently prevented from coming into the circuit, resulting in improved C/N and S/N characteristics.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A voltage-controlled oscillation circuit, comprising:

oscillation means having an oscillation frequency which changes in response to a control voltage;
   a power supply terminal for receiving power and supplying said oscillation means with power via a power supply line; and
   a low-pass filter including a capacitance element connected between said power supply line and ground, and a resistance element connected in series with said power supply line between said power supply terminal and said capacitance element,
   said capacitance element and resistance element having values which are determined so that the low-pass filter has a cutoff frequency which is at most a predetermined frequency of electrical noise superimposed on said power supply terminal, so as to remove said noise from said power supply line.

2. A voltage controlled oscillation circuit having an oscillation frequency which changes in response to a control voltage, comprising:

oscillation means having an oscillation frequency which is a function of said control voltage;
   an output terminal for connection to a load;
   output matching means connected to said output terminal for performing matching between said load and said oscillation circuit;
   buffer means connected between said oscillation means and said output matching means for limiting fluctuation in the oscillation frequency of said oscillation means due to changes of said load;
   a power supply terminal for receiving power and supplying said oscillation means with power via a power supply line; and
   a low-pass filter including a capacitance element connected between said power supply line and ground, and a resistance element connected in series with said power supply line between said power supply terminal and said capacitance element,
   said capacitance element and resistance element having values which are determined so that the low-pass filter has a cutoff frequency which is at most a predetermined frequency of electrical noise superimposed on said power supply terminal, so as to remove said noise from said power supply line.

3. A voltage-controlled oscillation circuit as recited in claim 2, wherein said power supply line is a common power supply line for commonly supplying power to both said oscillation means and said buffer means from said power supply terminal, said low-pass filter being interposed in said common power supply line.

4. A voltage-controlled oscillation circuit as recited in claim 2, wherein said power supply line comprises:

a first power supply line for supplying said oscillation means with power from said power supply terminal; and
   a second power supply line for supplying said buffer means with power from said power supply terminal;
   said low-pass filter including:
   a first low-pass filter interposed in said first power supply line, and
   a second low-pass filter interposed in said second power supply line.

5. A voltage-controlled oscillation circuit as recited in claim 2, wherein said power supply line comprises:

a first power supply line for supplying said oscillation means with power from said power supply terminal; and a second power supply line for supplying said buffer means with power from said power supply terminal;

said low-pass filter including:

a single resistance element interposed between said power supply terminal and both said first and second power supply lines, a first capacitance element connected between said first power supply line and ground, and a second capacitance element connected between said second power supply line and ground.

6. A voltage-controlled oscillator circuit, comprising:

an oscillator having an oscillation frequency which is responsive to a control voltage;

an output terminal for connection to a load;

an output matching circuit connected to said output terminal and to said oscillator for matching said oscillator to said load;

a buffer circuit connected between the oscillator and the output matching circuit which reduces fluctuation of said oscillation frequency in response to electrical characteristics of said load; and a power supply circuit, the power supply circuit comprising:

a power supply terminal for receiving power from a power source;

a power supply line for supplying power from the power supply terminal to the oscillator circuit; and a low-pass filter interposed between said power supply terminal and said power supply line, said low-pass filter including a capacitance element connected between said power supply line and ground, and a resistance element connected between power supply terminal and said power supply line, said capacitance and resistance elements having values which are determined so as to provide said low-pass filter with a cutoff frequency which is no greater than a predetermined frequency of undesirable electrical noise at said power supply terminal, for reducing transmission of said noise to said power supply line.

7. A voltage-controlled oscillator circuit as recited in claim 6, wherein said power supply line is a common power supply line for commonly supplying power to both said oscillator and said buffer circuit from said power supply terminal, said low-pass filter being interposed in said common power supply line.

8. A voltage-controlled oscillator circuit as recited in claim 6, wherein said power supply line comprises:

a first power supply line for supplying said oscillator with power from said power supply terminal; and a second power supply line for supplying said buffer circuit with power from said power supply terminal;

said low-pass filter including:

a first low-pass filter interposed in said first power supply line, and a second low-pass filter interposed in said second power supply line.

9. A voltage-controlled oscillator circuit as recited in claim 6, wherein said power supply line comprises:

a first power supply line for supplying said oscillator with power from said power supply terminal; and a second power supply line for supplying said buffer circuit with power from said power supply terminal;

said low-pass filter including:

a single resistance element interposed between said power supply terminal and both said first and second power supply lines, a first capacitance element connected between said first power supply line and ground, and a second capacitance element connected between said second power supply line and ground.

* * * * *